(12) United States Patent
Khesbak et al.

(10) Patent No.: US 6,339,361 B1
(45) Date of Patent: Jan. 15, 2002

(54) POWER AMPLIFIER DRIVER SYSTEM FOR WIRELESS HANDSET

(75) Inventors: Sabah Khesbak; Madhukar Reddy, both of Irvine; Pramote Piriyapoksombut, Millbrae; Trevor Robinson, Costa Mesa, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/328,927

(22) Filed: Jun. 9, 1999

(51) Int. Cl.[7] .............................. H03G 3/10; H03G 5/16; H03G 3/20
(52) U.S. Cl. ...................... 330/285; 330/133; 330/134; 330/279; 330/129
(58) Field of Search ............................ 330/129, 133, 330/134, 279, 285, 254, 51, 126

(56) References Cited

U.S. PATENT DOCUMENTS

| | | | |
|---|---|---|---|
| 3,968,453 A | * 7/1976 | Hongu et al. | 330/254 |
| 4,257,009 A | * 3/1981 | Yorkanis | 330/51 |
| 4,446,440 A | * 5/1984 | Bell | 330/10 |
| 5,179,353 A | 1/1993 | Miyake | 330/129 |
| 5,432,473 A | * 7/1995 | Mattila et al. | 330/133 |
| 5,530,923 A | * 6/1996 | Heinonen et al. | 330/51 |
| 5,625,322 A | 4/1997 | Gourgue et al. | 330/129 |
| 5,757,230 A | * 5/1998 | Mangelsdorf | 330/133 |
| 5,838,807 A | * 11/1998 | Andersson et al. | 381/321 |
| 5,880,631 A | * 3/1999 | Sahota | 330/254 |
| 5,907,798 A | * 5/1999 | Abramsky et al. | 330/129 |
| 6,107,878 A | * 8/2000 | Black | 330/129 |

FOREIGN PATENT DOCUMENTS

| | | |
|---|---|---|
| EP | 0 599 327 A1 | 1/1994 |
| EP | 0 818 880 A2 | 1/1998 |
| WO | 98/49771 | 5/1998 |

OTHER PUBLICATIONS

"RF Microelectronics"; B. Razavi, Prentice Hall, 1998, pp. 302–305.

\* cited by examiner

*Primary Examiner*—Robert Pascal
*Assistant Examiner*—Patricia T. Nguyen
(74) *Attorney, Agent, or Firm*—Howrey Simon Arnold & White LLP

(57) ABSTRACT

A driver system for a power amplifier in a wireless communication handset. The driver system includes a driver and a current source. The driver drives the power amplifier at a level of linearity determined responsive to a variable input bias current provided by the current source. The current source varies the bias current, and thus the degree of linearity provided, responsive to the desired output power of the handset.

48 Claims, 15 Drawing Sheets

POWER AMPLIFIER DRIVER SYSTEM FOR WIRELESS HANDSET

BACKGROUND OF THE INVENTION

This invention relates generally to the field of handsets for wireless communication systems, and more specifically, to drivers for power amplifiers configured for use in such handsets.

A problem with many cellular handsets is limited battery lifetime, which translates into reduced talk-time. Current handset designs utilizing Class A power amplifier drivers are optimized for maximum output power levels at which a high degree of linearity is required to reduce intermodulation distortion and channel leakage. More specifically, the driver current level is chosen to achieve the required level of linearity at maximum output power levels. Class A amplifiers for cellular handsets are described at pages 302–305 of B. Razavi, "RF Microelectronics,: Prentice Hall, 1998, which is hereby fully incorporated by reference herein as through set forth in full. Consequently, at low and medium power levels at which a lower degree of linearity is sufficient, there is excessive current consumption in the driver circuitry in such handsets. The excessive current consumption drains battery power and reduces the handset talk-time.

Hence, there is a need for a wireless communication handset in which current consumption in the driver circuitry thereof is reduced at low to medium output power levels.

SUMMARY OF THE INVENTION

Figure 1:
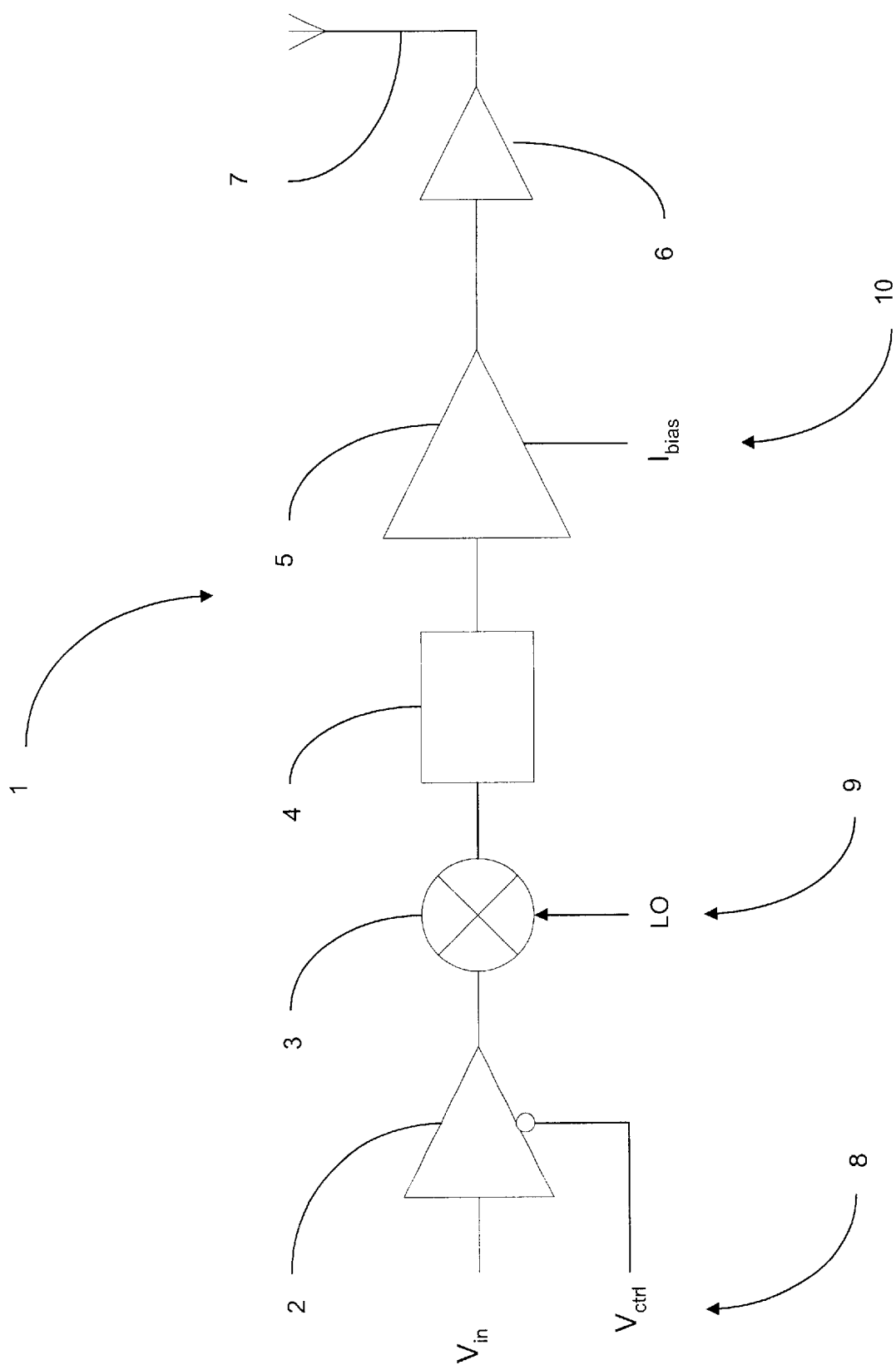
FIG. 1 illustrates a first example environment of the subject invention.

In accordance with the purpose of the invention as broadly described herein, there is provided a driver system for a power amplifier comprising a driver and a variable current source for providing current to the driver responsive to a control signal representative of a desired output power level of the power amplifier.

In one embodiment, the driver system is part of a transmission system configured for use in a CDMA wireless handset. The transmission system further comprises a variable gain amplifier (VGA) having first and second inputs and an output. A signal derived from the output of the VGA is input to the driver. The control signal is coupled to the second input of the VGA. The VGA amplifies a signal provided at the first input thereof. The level of amplification is determined responsive to the control signal provided to the second input thereof. The control signal in this embodiment is derived from a signal used to implement closed loop power control.

In one implementation, the transmission system further comprises a power amplifier. A signal derived from the output of the driver is input to the power amplifier. In one implementation example, the power amplifier is a class A power amplifier, and the driver is a class A power amplifier driver.

In a second embodiment, the current source comprises a first portion configured to provide a substantially fixed current, and a second portion configured to provide a variable current responsive to a control signal indicative of the desired output power of the power amplifier. The substantially fixed current in this embodiment defines a floor for the output of the current source.

In one implementation, the current source comprises at least one differential pair circuit, with the number of differential pair circuits selected to achieve a desired slope of the output current as a function of differential input voltage. Implementation examples in which one or more than one differential pair circuits are included are contemplated.

One implementation of the first differential pair circuit in this embodiment comprises a substantially fixed current source, a differential pair of NPN bipolar transistors, and first and second current mirrors. The emitters of the two transistors are coupled to one terminal of the current source, the other terminal of which is coupled to ground. Differential mode input voltage signals are coupled to respective ones of the bases of the two transistors. The collector of the first one of the transistors is coupled to the supply voltage, and the collector of the second of the two transistors is coupled to the first current mirror. A first current is generated on the collector of the second transistor which is exponentially related to the difference in the differential mode component of the differential mode input signal. A second current proportional to this current is produced by the first current mirror. It constitutes the output of the first current mirror.

The input of the second current mirror is coupled to the output of the first current mirror. A current proportional to the current output from the first current mirror is produced by the second current mirror between first and second nodes.

One implementation of a second differential pair circuit, if one is present, comprises first and second current mirrors, and a differential pair of NPN bipolar transistors. The emitters of the two transistors are coupled to the first node of the second current mirror of the first differential pair circuit, the second node of which is coupled to ground. A current is output by the first current mirror of the second differential pair circuit which is proportional to the current produced by the second current mirror of the first differential pair circuit. The differential mode input voltage signals are coupled to respective ones of the bases of the two transistors. The collector of the first one of the two transistors is coupled to the supply voltage. The collector of the second one of the two transistors is coupled to the first current mirror of the second differential pair circuit. A first current is generated on the collector of the second transistor which is exponentially related to the difference between the two differential mode input signals. The first current mirror generates a second current which is proportional to this first current. It constitutes the output of the first current mirror.

The input of the second current mirror of the second differential pair circuit is coupled to the output of the first current mirror thereof. A current proportional to the current output from the first current mirror is provided between first and second nodes of the second current mirror.

A third differential pair circuit, if one is present, is coupled to the second differential pair circuit in the same manner that the second differential pair circuit is coupled to the first differential pair circuit. This configuration repeats itself for each subsequent differential pair circuit which is included. In the final differential pair circuit, a current is provided between first and second nodes of the second current mirror thereof. The second node is coupled to the bias current input of the driver, and the first node is coupled to the supply voltage.

In one implementation example, in which the differential mode input voltage signals are represented as $V_{ctrl}^+$ and $V_{ctrl}^-$, the substantially fixed current source in the first differential pair circuit is represented as $I_{EE}$, and n differential pair circuits are included, the output current $I_n$ is given by the following equation:

$$I_n = K_1 \times \ldots K_n \times I_{EE} e^{n(V_{ctrl+} - V_{ctrl-})/V_T}$$

where $V_T = kT/q$, and is about 25 mV at 25° C.

Related methods of operation are also provided.

DESCRIPTION OF THE PREFERRED EMBODIMENTS

FIG. 1 illustrates a first example environment of the subject invention. It represents the transmission system 1 in a wireless communication handset. As illustrated, the system comprises variable gain amplifier (VGA) 2 for amplifying an input signal $V_{in}$. The level of amplification of VGA 2 is controlled by the control input signal $V_{ctrl}$, identified in the figure with numeral 8. The system further comprises one or more mixers 3 for mixing the signal output from VGA 2 to radio frequencies (RF) in one or more stages. One or more signals from a local oscillator (LO), identified in the figure with numeral 9, are input to the mixer for performing this function.

The system further comprises filtering and other processing circuitry 4, driver 5, power amplifier 6, and antenna 7. The circuitry 4 is configured to bandlimit and perform other processing tasks on the signal from mixer 3. Driver 5 receives the signal output from circuitry 4, and produces a driving signal for power amplifier 6 responsive to a bias current $I_{bias}$, identified in the figure with numeral 10, provided as a control input to the driver. The output of the driver is input to power amplifier 6. The signal output from power amplifier 6 is then provided to antenna 7 for transmission over wireless communication interface to another component of a wireless communication system, such as a base station.

In one implementation example, power amplifier 6 is a class A power amplifier, and driver 5 is a class A power amplifier driver. In this implementation example, the output of driver 5 is about 8 dBm, and the output of power amplifier 6 is about 29 dBm.

Figure 2:
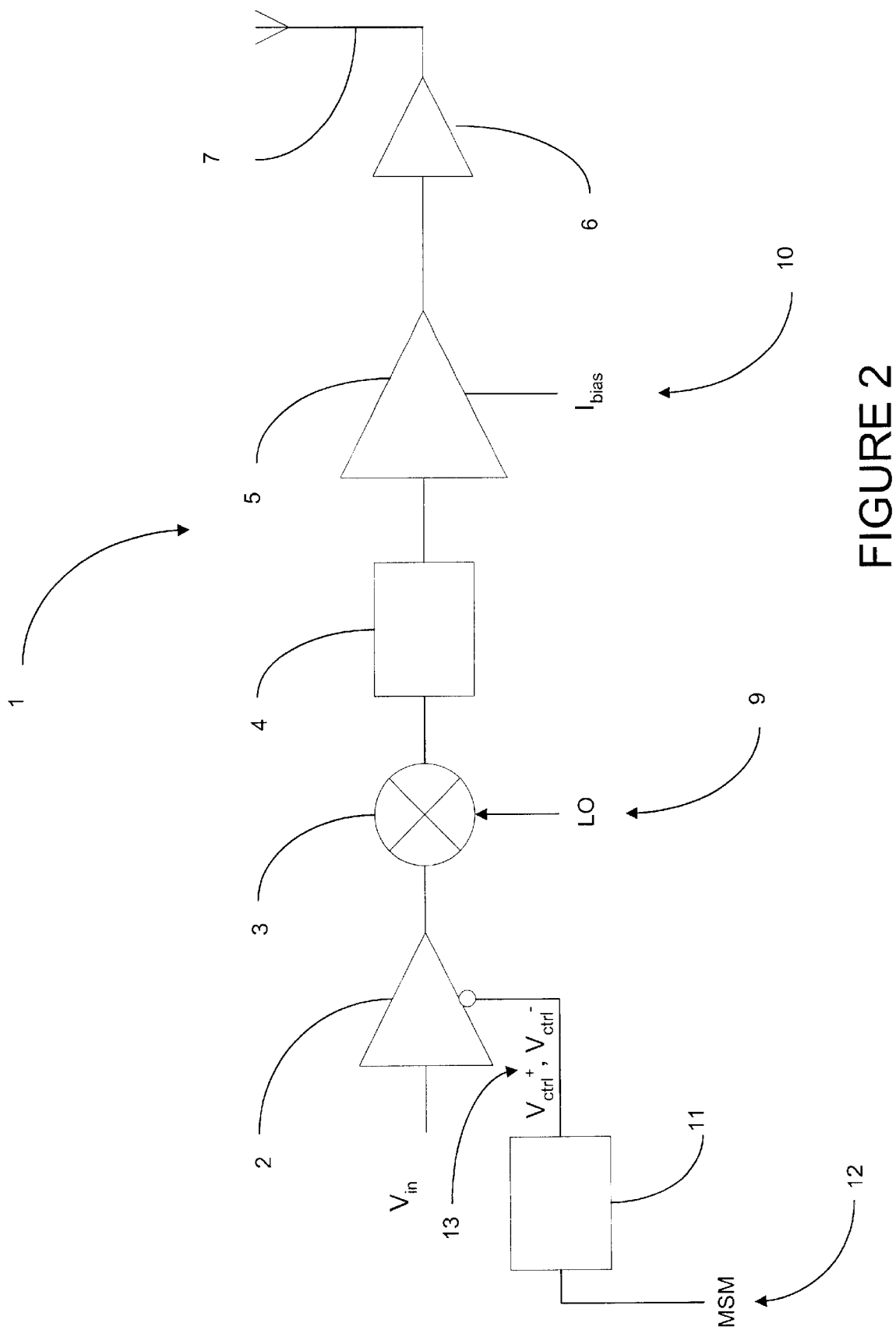
FIG. 2 illustrates a second example environment of the subject invention.

FIG. 2 illustrates a second example environment of the subject invention. In relation to FIG. 1, like elements in FIG. 2 are referenced with like identifying numerals. FIG. 2 illustrates a transmission system 1 for a wireless communication handset configured for use in a code division multiple access (CDMA) wireless system, including but not limited to CDMA systems subject to the IS-95A, ANSI J-STD-008, IS-95B, IS-95C, and TIA/EIA-05 standards.

As is known, CDMA systems currently employ a technique known as closed loop power control in which the level of power transmitted by the mobile handset is controlled to avoid a near/far problem and also to maximize capacity of the system. The near/far problem occurs when a first mobile situated closer to the base station than a second mobile station but transmitting at the same power as the other drowns out the second unit due to the greater level of power received from the first mobile. Closed loop power control is employed to regulate the transmitted power of the mobiles so that the received power from each at the base station is about the same.

The capacity of a CDMA system, in terms of the number N of simultaneous calls that can be placed, is given by the following formula:

$$N = \frac{\frac{W}{R}(1-\eta)G_s}{\frac{E_b}{I_o}(1+f)v},$$

where W is the system bandwidth, R is the data rate, $\eta$ is the ratio of the thermal noise spectral density to the interference noise spectral density $I_o$, $G_s$ is the sectorization gain, $E_b$ is the energy transmitted per bit, $I_o$ is the interference noise spectral density (representing the noise from transmissions of other users), f is a factor representing interference from other cells, and v is the voice activity factor. As can be seen from the foregoing equation, capacity is optimized if the $E_b/I_o$ factor is kept to a minimum. Closed loop power control regulates $E_b/I_o$ to ensure that it does not exceed a target $E_b/I_o$ value, which is in turn determined to avoid exceeding a target frame error rate (FER).

In FIG. 2, the mobile station modem (MSM) signal, identified with numeral 12, is used to implement closed loop power control. The MSM signal is generated in response to closed loop power control commands generated at the base station. A circuit 11 converts the MSM signal to differential mode signals $V_{ctrl}^+$, $V_{ctrl}^-$, identified in the figure with numeral 13. These differential mode signals 13 are input to VGA 2, and control the level of amplification thereof. Additional detail on the circuitry 11 is provided in U.S. patent application Ser. No. 09/163,885, filed Sep. 30, 1998, "VARIABLE GAIN AMPLIFIER WITH GAIN LINEAR WITH CONTROL VOLTAGE," owned in common by the assignee hereof, which is hereby fully incorporated by reference herein as though set forth in full.

Figure 3:
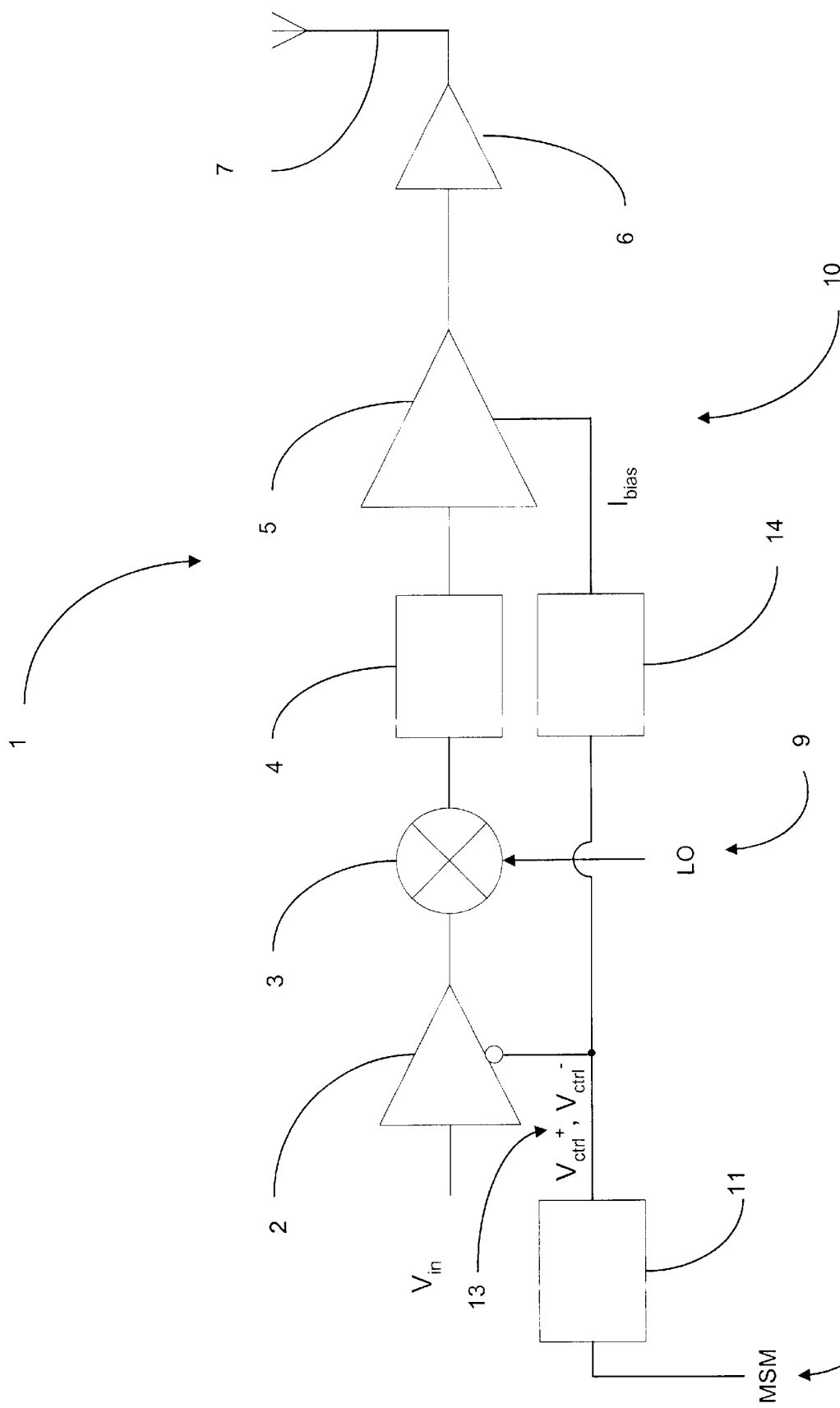
FIG. 3 illustrates an overview of an embodiment of the subject invention in the example environment of FIG. 2.

FIG. 3 illustrates a first embodiment of the subject invention in the context of the example environment of FIG. 2. As shown, a driver system comprises driver 5 and current source 14 for providing a bias current $I_{bias}$ to the driver 5. The driver system is part of a transmission system further comprising power amplifier 6, antenna 7, VGA 2, mixer 3, filtering and processing circuitry 4, and circuitry 1. The $V_{ctrl}^+$, $V_{ctrl}^-$ signals provided by circuitry 11 are input to current source 14. Current source 14, responsive to the $V_{ctrl}^+$, $V_{ctrl}^-$ signals, outputs a bias current $I_{bias}$ to the driver 5. Unlike conventional systems in which the driver bias current is fixed and optimized for maximum power output, the bias current in the system of FIG. 3 is configured to vary at least in part with the desired power output. The result is reduced bias current to the power amplifier driver at low or medium power output levels. Although the reduced bias current typically translates into reduced linearity by the power amplifier, such is of no moment given that less linearity is required at low or medium power output levels, and the bias current which is provided will achieve the required degree of linearity. The heightened degree of linearity required at maximum output power levels, although imposed at all power levels in conventional systems through the fixed bias current, can be relaxed at low and medium power levels by varying the bias current to the power amplifier driver. A variable linearity driver is thus provided, in which heightened levels of linearity are provided only at those power levels which require it.

Figure 4A:
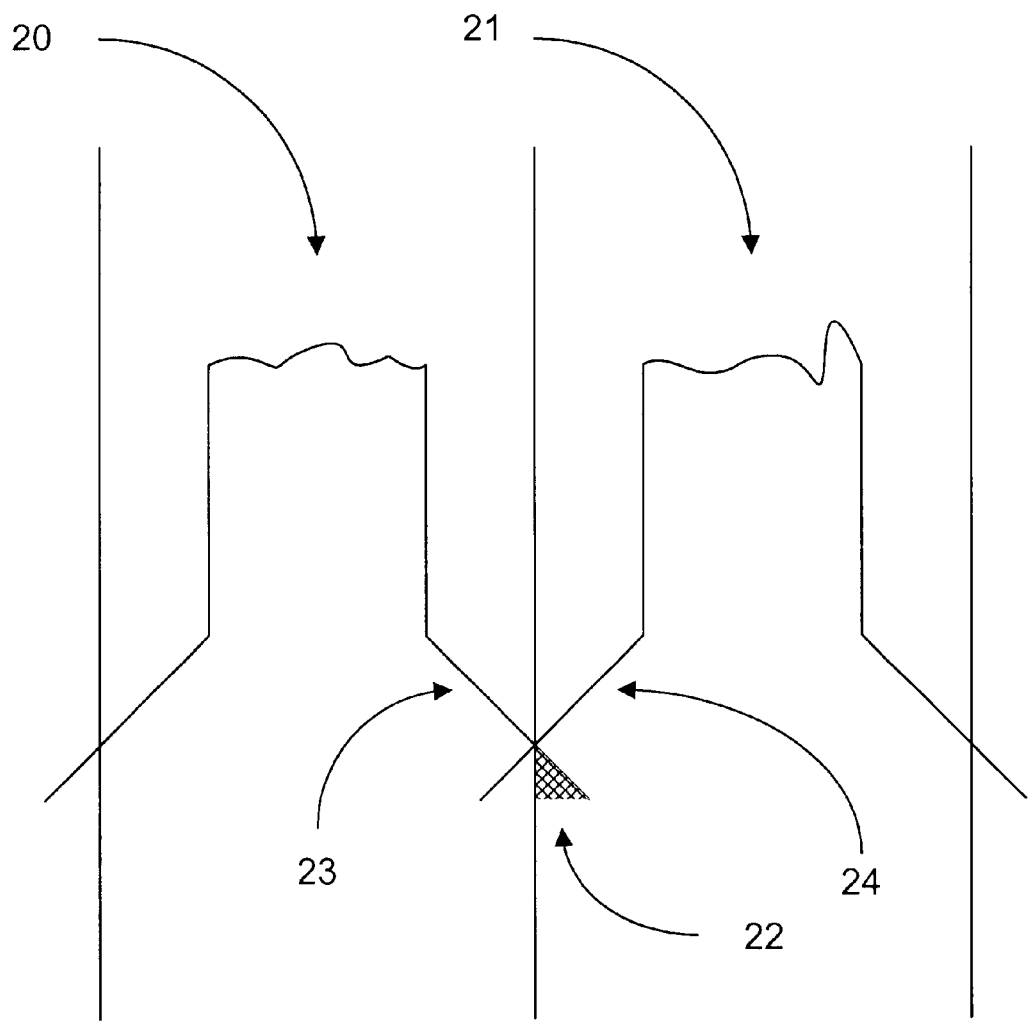
FIGS. 4A–4C illustrates the principle that less linearity is required at low to medium output levels to avoid exceeding a certain level of channel leakage.
Figure 4B:
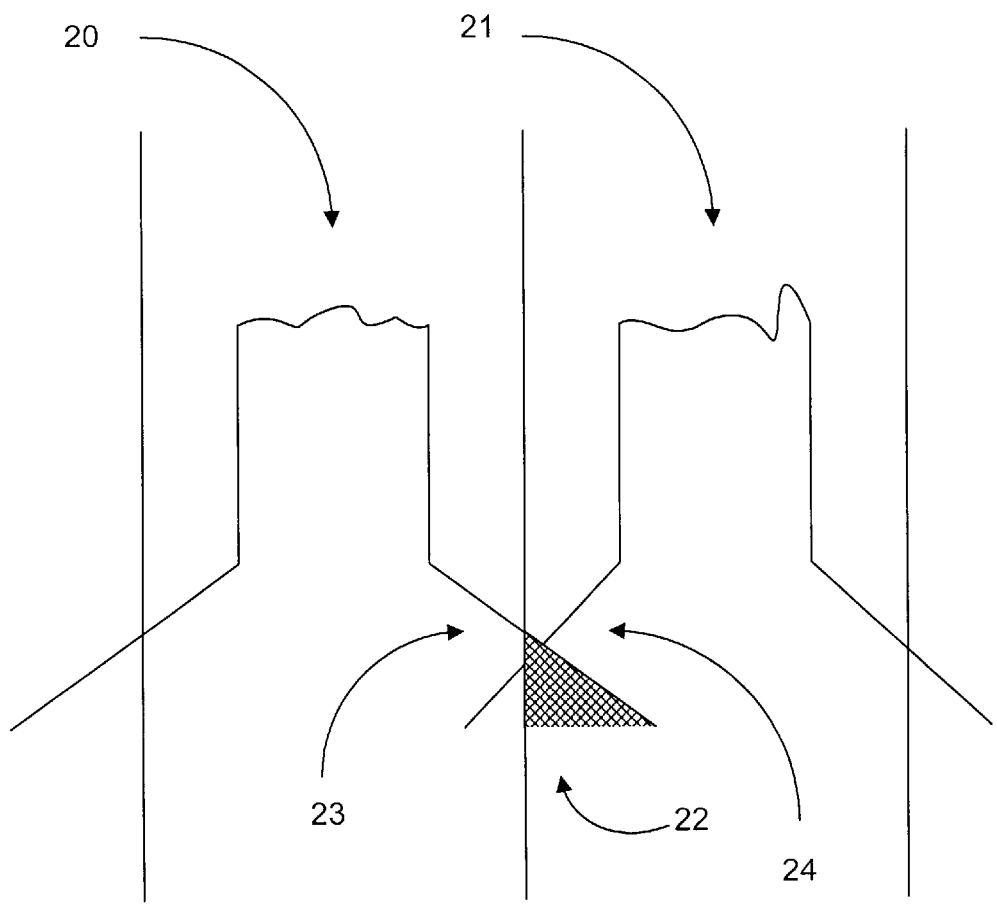
Figure 4C:
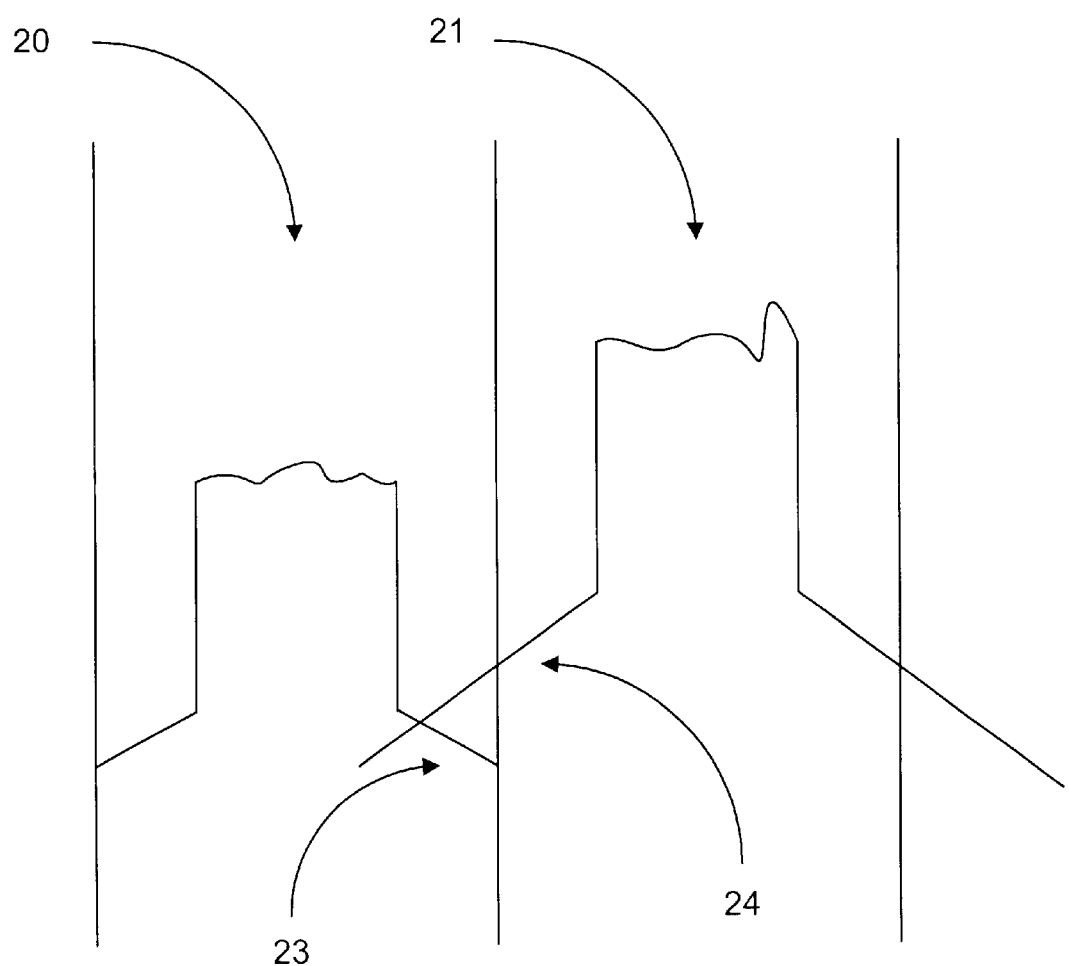

The foregoing principle is illustrated in FIGS. 4A–4C in which like elements are referenced with like identifying numerals. These figures illustrate channel leakage that occurs between adjacent channels 20 and 21. Numeral 22 in FIG. 4A identifies the amount of leakage which occurs from channel 20 to channel 21 with a power amplifier which is configured to have a high degree of linearity. In accordance with applicable standards, the amount of leakage which is illustrated is assumed not to exceed −42 dBc. Numeral 22 in FIG. 4B the greater amount of leakage that occurs when linearity is relaxed in relation to FIG. 4A. FIG. 4C illustrates transmission at a reduced power level in relation to FIGS. 4A and 4C, but at the same reduced level of linearity as FIG. 4B. As can be seen, leakage from channel 20 to 21 is essentially eliminated despite the reduced level of linearity. These figures illustrate the principle that the heightened degree of linearity required at maximum power levels to reduce channel leakage to an acceptable level is not required at lower output power levels to achieve the same reduction in channel leakage.

Figure 5:
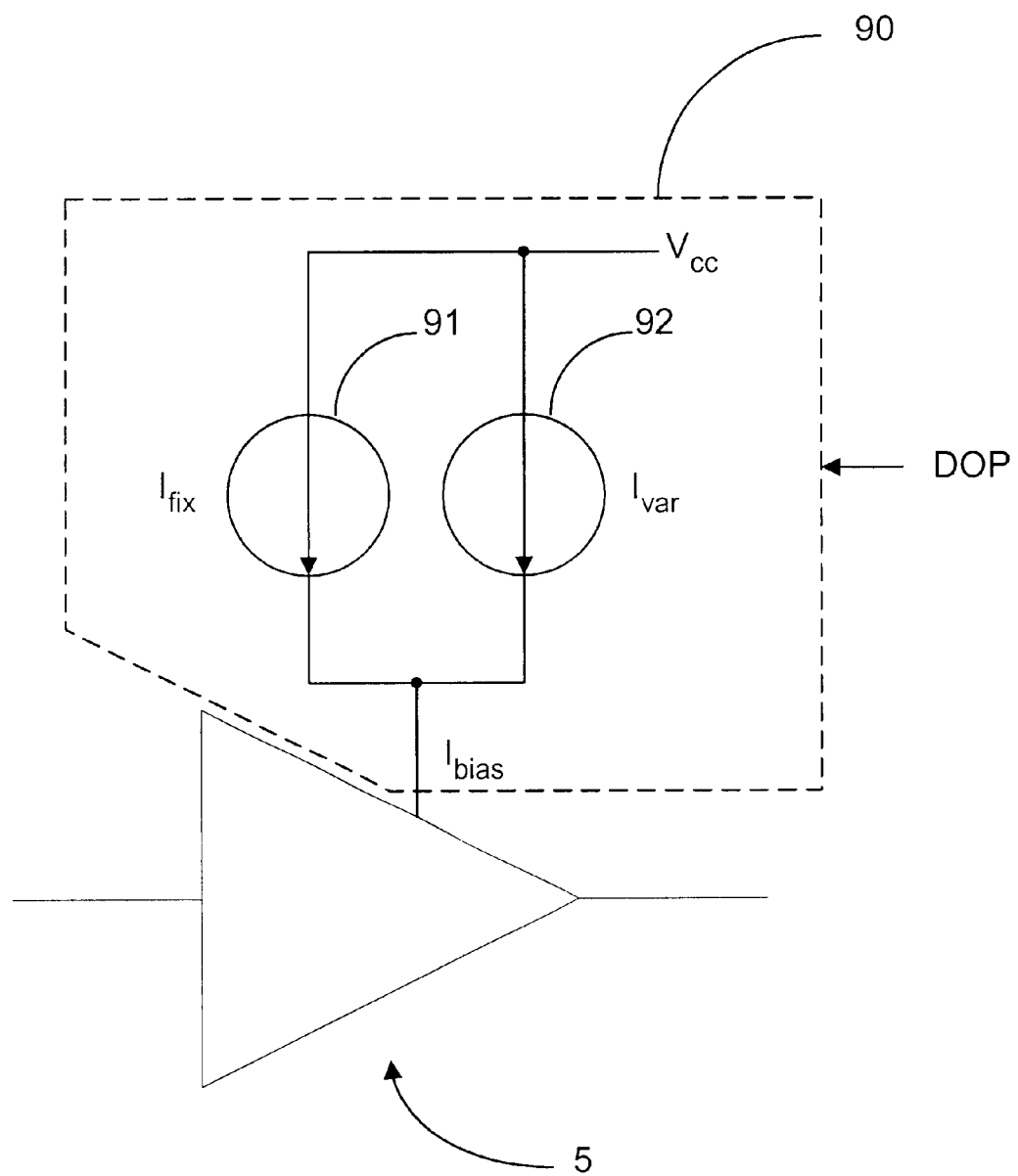
FIG. 5 illustrates a second embodiment of the subject invention.

FIG. 5 illustrates a second embodiment of a driver system of the subject invention in which a current source 90 provides a bias current $I_{bias}$ to power amplifier driver 5. The current source 9 has a first portion 91 for providing as a component of $I_{bias}$ a substantially fixed current $_{fix}$, and a second portion 92 for providing as a component of $I_{bias}$ a variable current $I_{var}$ which is proportional to the desired output power (DOP) of the power amplifier. In one implementation, the driver system is part of a transmission system including a power amplifier which is driven by the driver system. In one implementation example, the power amplifier is a class A power amplifier, and the driver 5 is a class A power amplifier driver.

Figure 6A:
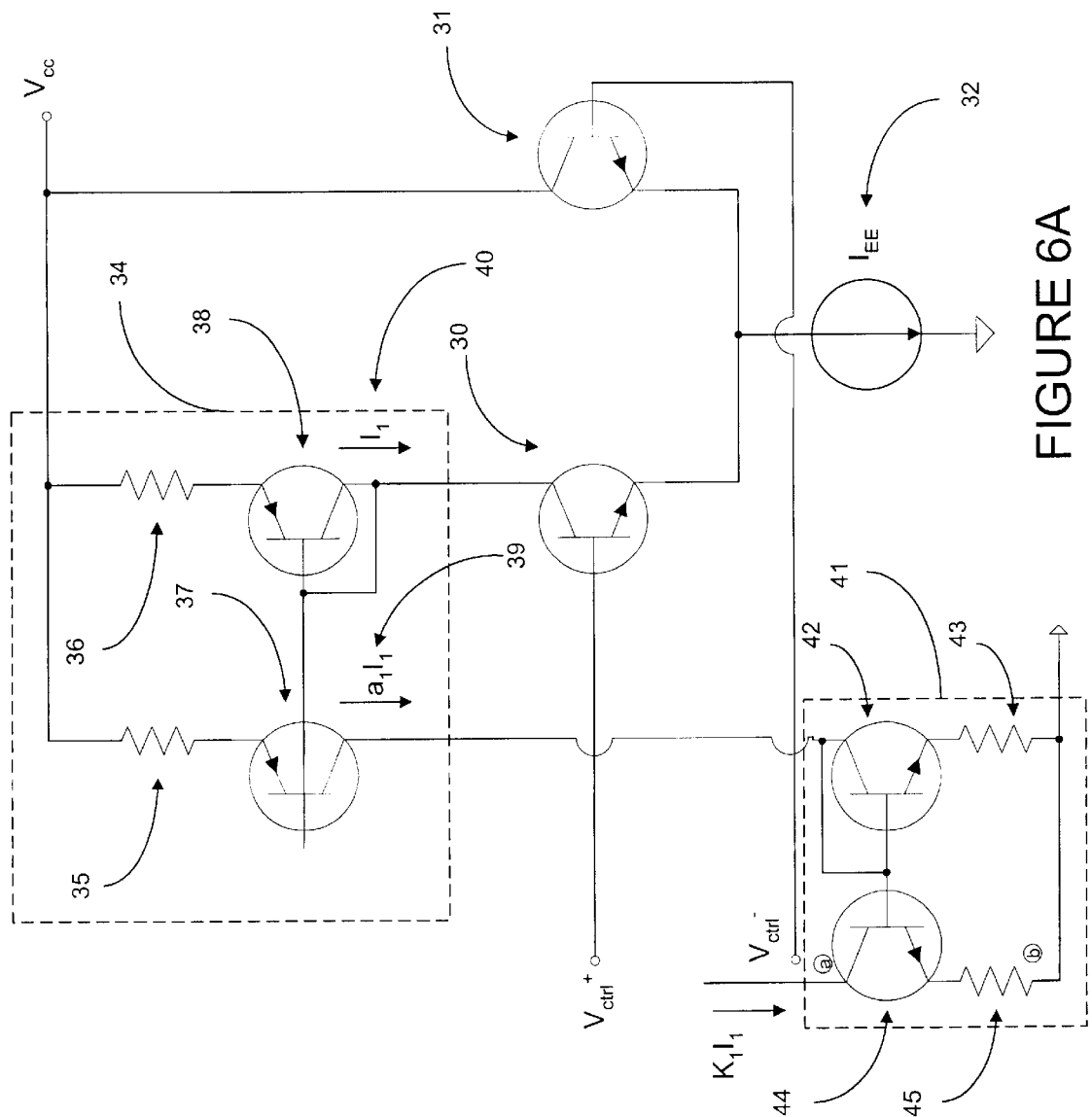
FIGS. 6A–6E illustrate an implementation example of the subject invention.
Figure 6B:
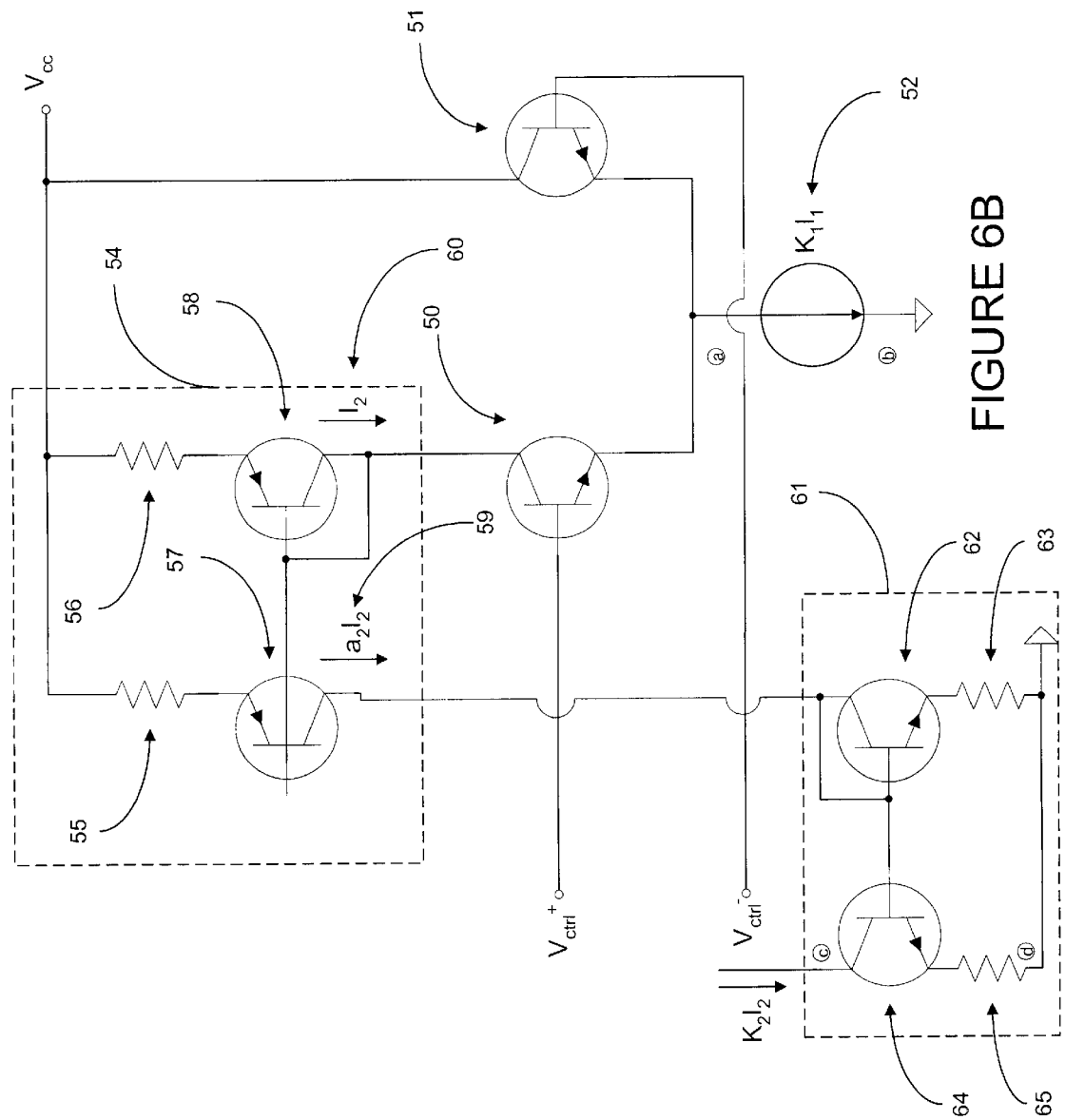
Figure 6C:
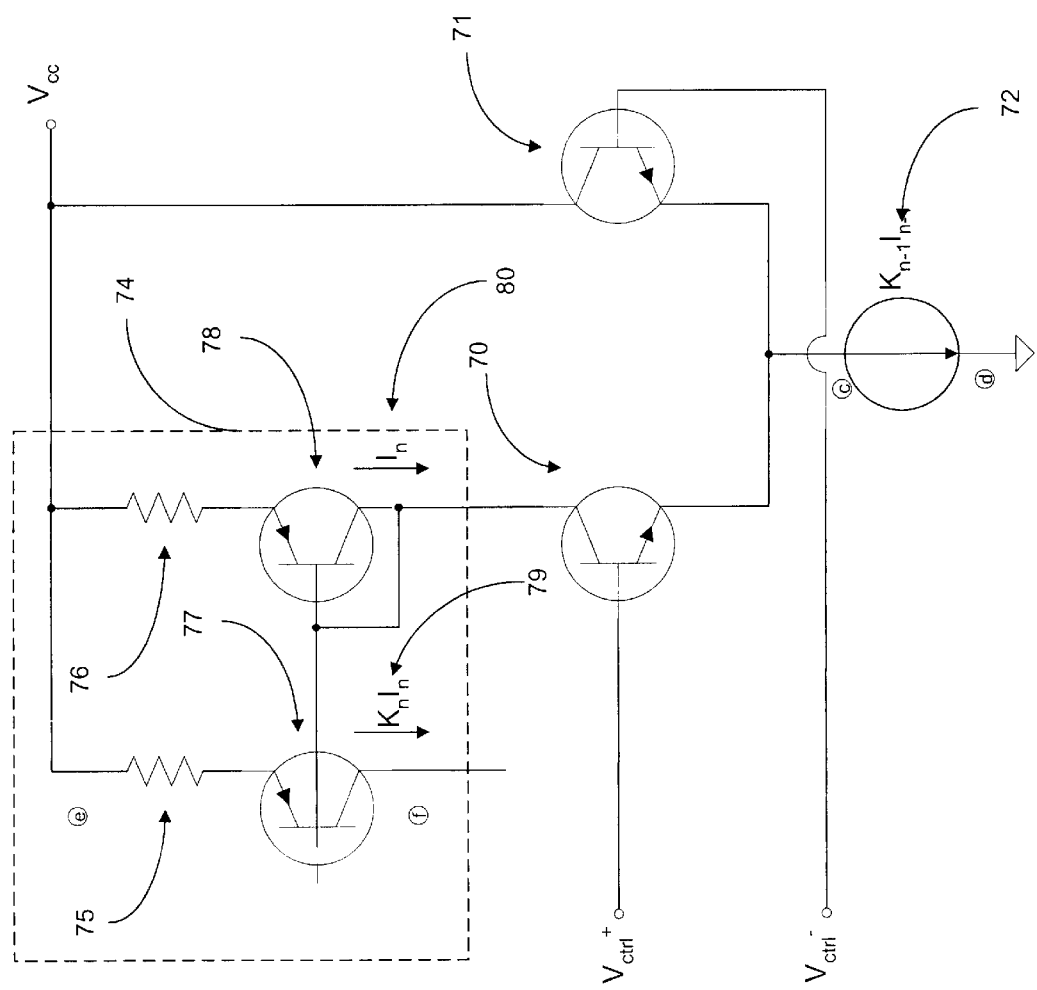

FIGS. 6A–6C illustrate an implementation example of one embodiment of the driver system of the subject invention, in which current source 90 comprises at least one differential pair circuit, the number of differential pair circuits being selected to achieve a desired slope of the output current as a function of differential input voltage. Implementation examples comprising one or more than one differential pair circuits are expressly contemplated.

The implementation example illustrated in FIGS. 6A–6C comprises n differential pair circuits, wherein n is an integer equal to 1 or more. FIG. 6A illustrates one implementation of a first differential pair circuit comprising a substantially fixed current source 32, a differential pair 30, 31 of NPN bipolar transistors, a first current mirror 34, and a second current mirror 41. The current source 32 provides a substantially fixed current $I_{EE}$ which flows from a first terminal of the current source to a second terminal. The emitters of the two transistors are coupled to the first terminal of the current source 32, the other terminal of which is coupled to ground. Differential mode input voltage signals $V_{ctrl}^+$, $V_{ctrl}^-$ are respectively coupled to the bases of the two transistors. The collector of a first one 31 of the transistors is coupled to the supply voltage, and the collector of the second one 30 of the two transistors is coupled to the first current mirror 34. A current $I_1$ is generated on the collector of the second transistor 30 which is exponentially related to the difference between the differential mode input signals. The relationship between $I_1$ and the differential mode input voltage signals $V_{ctrl}^+$, $V_{ctrl}^-$ is given by the following equation:

$$I_1 = I_{EE} e^{\frac{(V_{ctrl}^+ - V_{ctrl}^-)}{V_T}},$$

in which $V_T = kT/q$. At 25° C., $V_T$ is 25 mV.

The first current mirror 34 comprises PNP transistors 37 and 38, and resistors 35 and 36 configured together as shown. Current mirrors are known to those of skill in the art, and need not be discussed in detail. Suffice it to say that a current mirror mirrors an input current to provide an output current proportional to the input current depending on the degree to which the two transistors in the circuit are matched. In the circuit of FIG. 6A, a current $a_1 \times I_1$ is produced by the current mirror 34, where $a_1$ is a constant greater or less than unity. This current constitutes the output of the first current mirror.

The second current mirror 41 comprises NPN transistors 42 and 44, and resistors 43 and 45 configured together as shown. The input of the second current mirror 41, the collector of transistor 42, is coupled to the output of the first current mirror 34. A current $K_1 \times I_1$ is mirrored in the second current mirror 41 between nodes a and b, where $K_1$ is a constant greater or less than unity which may be the same or different from $a_1$.

One implementation of a second differential pair circuit is illustrated in FIG. 6B. It comprises current source 52, a pair 50, 51 of NPN bipolar transistors, a first current mirror 54, and a second current mirror 61. The current source 52 comprises the first differential pair circuit illustrated in FIG. 6A. The precise manner in which the circuit of FIG. 6A is integrated into that of FIG. 6B is indicated by the node designations a and b appearing in both figures. That is to say, node a in FIG. 6A is coupled to node a in FIG. 6B, and node b in FIG. 6A is coupled to node b in FIG. 6B.

The emitters of the two transistors 50, 51 are coupled to node a as shown, and node b is coupled to ground. The differential mode input voltage signals $V_{ctrl}^+$, $V_{ctrl}^-$ are coupled respectively to the bases of the two transistors 50 and 51. The collector of a first one 51 of the two transistors is coupled to the supply voltage. The collector of a second one 50 of the two transistors is coupled to the current mirror 54. A current $I_2$ is generated on the collector of the second 58 of the two transistors which is exponentially related to the difference between the differential mode input voltage signals $V_{ctrl}^+$, $V_{ctrl}^-$. The precise relationship is governed by the following equation: $I_2 = K_1 I_1 e^{(V_{ctrl}^+ - V_{ctrl}^-)/V_T}$. Plugging in the previous equation for $I_1$, the following results: $I_2 = K_1 I_{EE} e^{2(V_{ctrl}^+ - V_{ctrl}^-)/V_T}$.

The first current mirror 54 comprises PNP transistors 57 and 58, and resistors 55 and 56, coupled together as shown. A current $a_2 \times I_2$, identified with numeral 59, is produced in the first current mirror as shown, where $a_2$ is a constant greater or less than one. This current constitutes the output of the first current mirror.

The second current mirror 61 comprises NPN transistors 62 and 64, and resistors 63 and 65, coupled together as shown. The input of the second current mirror is coupled to the output of the first current mirror. The current $a_2 \times I_2$ is input to the second current mirror, and a current $K_2 \times I_2$ is mirrored between nodes c and d as shown, where $K_2$ is a constant greater or less than one, which may be the same or different from $a_2$.

Additional differential pair circuits are added in a manner similar to that in which the circuit of FIG. 6B is added to FIG. 6A until n differential pair circuits have been incorporated. FIG. 6C illustrates one implementation of the nth differential pair circuit which has been added. As can be seen, this circuit comprises current source 72, a differential pair 70, 71 of NPN bipolar transistors, and first current mirror 74. This differential pair circuit is coupled to the (n−1)th differential pair circuit in the same manner that the second differential pair circuit is coupled to the first differential pair circuit. An output current $I_o=K_n I_n$ is produced between nodes e and f which is given by the following equation: $I_o = K_1 \times K_2 \times \ldots \times K_n \times I_{EE} e^{n(V_{ctrl+} - V_{ctrl-})/V_T}$.

Current source 72 is the second current mirror of the previous differential pair circuit. In the case in which three differential pair circuits are provided, and the third such circuit is illustrated in FIG. 6C, and the second such circuit is illustrated in FIG. 6B, the current source 72 is the second current mirror 61. The precise manner in which second current mirror 61 is coupled to the circuit of FIG. 6C is indicated by nodes c and d. That is to say, node c in FIG. 6B is coupled to node c in FIG. 6C, and node d in FIG. 6B is coupled to node d in FIG. 6C.

Figure 6D:
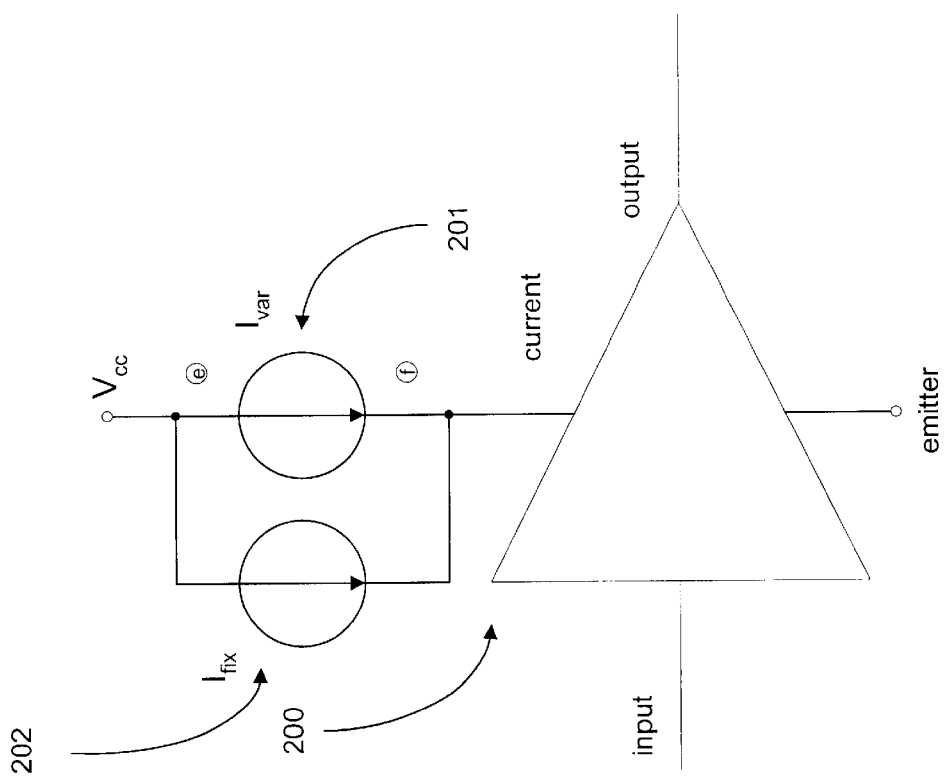
Figure 6E:
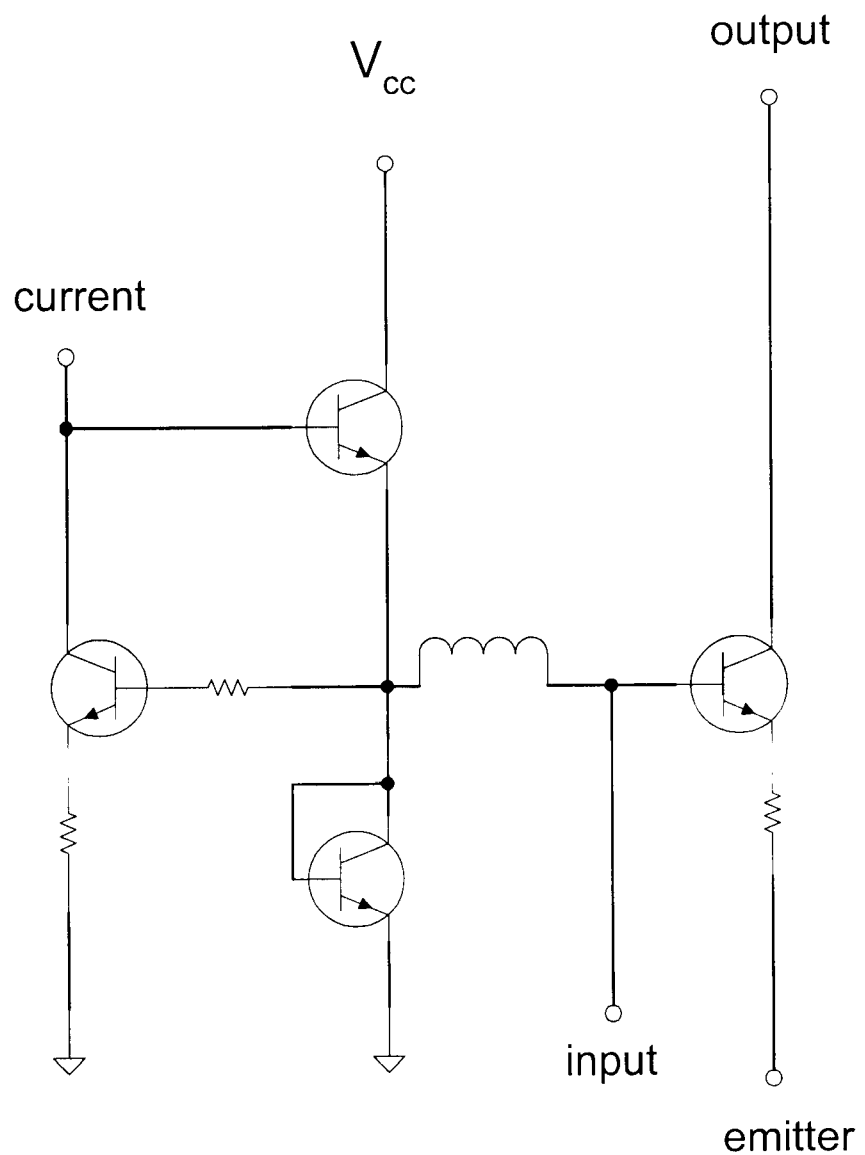

The output current $I_o$ is provided between nodes e and f in first current mirror 74 in FIG. 6C. The precise manner in which this output current is provided as the bias current to a driver is illustrated in FIG. 6D. As shown, driver 200 is provided having an input, an output, a current input, and an emitter node. The combined current sources 201 and 202 illustrated in FIG. 6D is the first current mirror 74 in FIG. 6C. More specifically, node e in FIG. 6C is coupled to node e in FIG. 6D, and node f in FIG. 6C is coupled to node f in FIG. 6D. An implementation example of driver 200 is illustrated in FIG. 6E.

Figure 8:
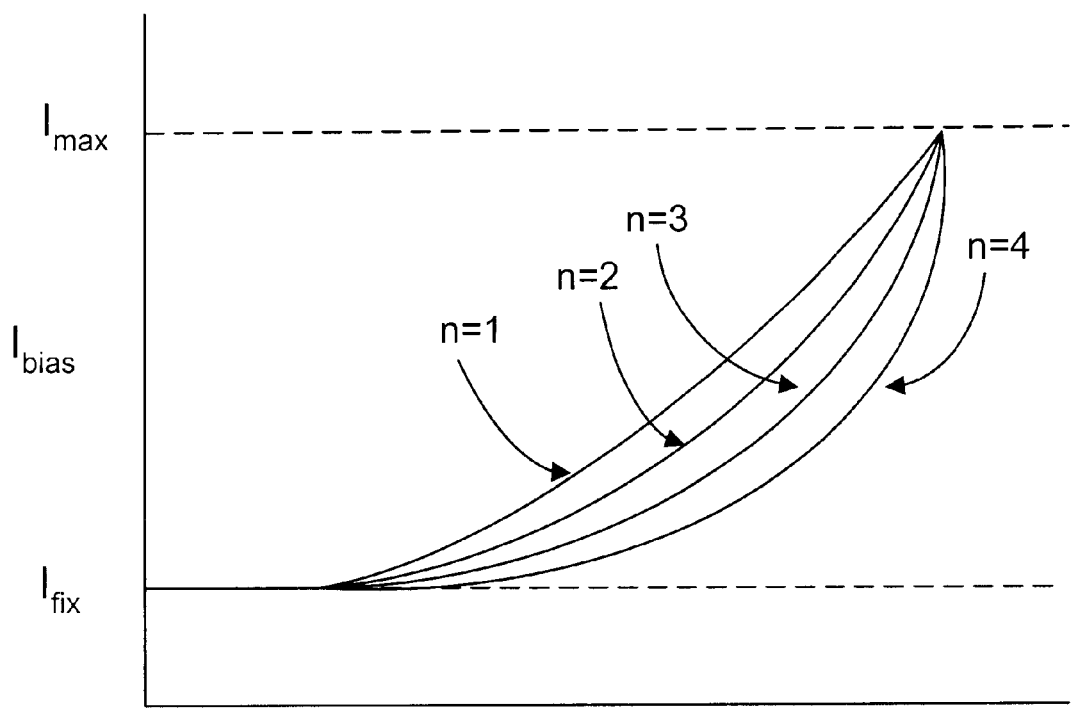
FIG. 8 is exemplary curves illustrating the relationship between output current and differential input voltage as a function of the number of differential pair circuits in the current source in accordance with one implementation of the subject invention.

The general shape of the curve depicting the relationship between $I_o$ and $V_{ctrl}^+$, $V_{ctrl}^-$, for different values of n is illustrated in FIG. 8. As can be seen, the greater the value of n, the steeper the curve. Thus, the number of differential pair building blocks used in the final circuit depends on the desired slope of the $I_o$ versus $(V_{ctrl}^+ - V_{ctrl}^-)$ relationship. In one commercial embodiment, the number of differential pair circuits selected was 9 to achieve a desired slope of the curve describing the relationship between $I_o$ and the MSM signal.

Figure 9:
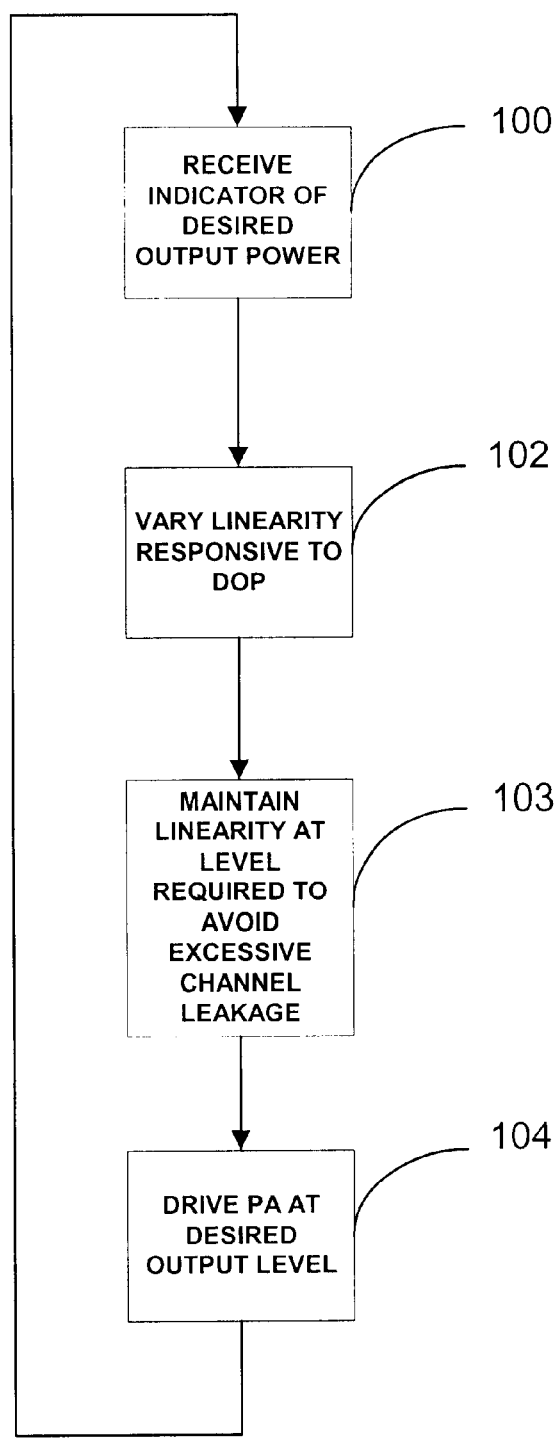
FIG. 9 illustrates a method of operation of the subject invention.

Thus, a variable linearity transmission system is provided in which the degree of linearity provided by the system varies in proportion to the desired output power level, such that the degree of linearity provided at reduced power levels is also reduced, subject to the condition that a threshold level of linearity is always maintained to avoid excessive channel leakage. A method of operation of a transmission system in accordance with this principle is illustrated in FIG. 9. In step 100, an indicator is received of the desired output power level. In step 102, the linearity of the transmission system is varied responsive to the desired output power level subject to the condition, implemented in step 103, that the level of linearity always be sufficiently high to avoid excessive channel leakage and/or intermodulation distortion. In step 104, the system outputs power at the desired level. Then, the process repeats itself.

Figure 7A:
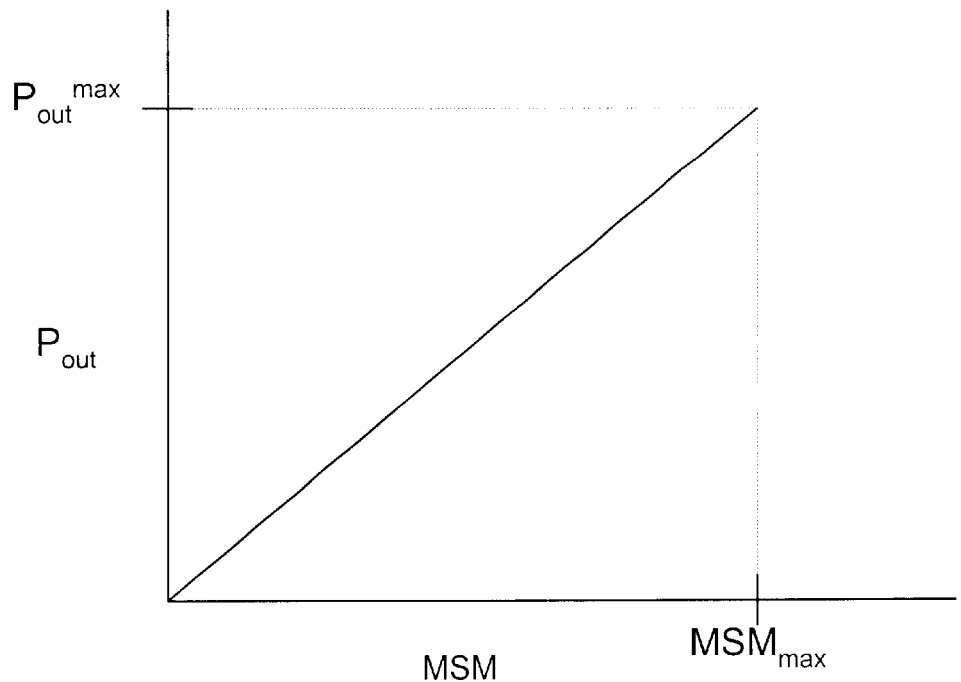
FIGS. 7A–7B illustrate the current savings achievable through use of one embodiment of the subject invention.
Figure 7B:
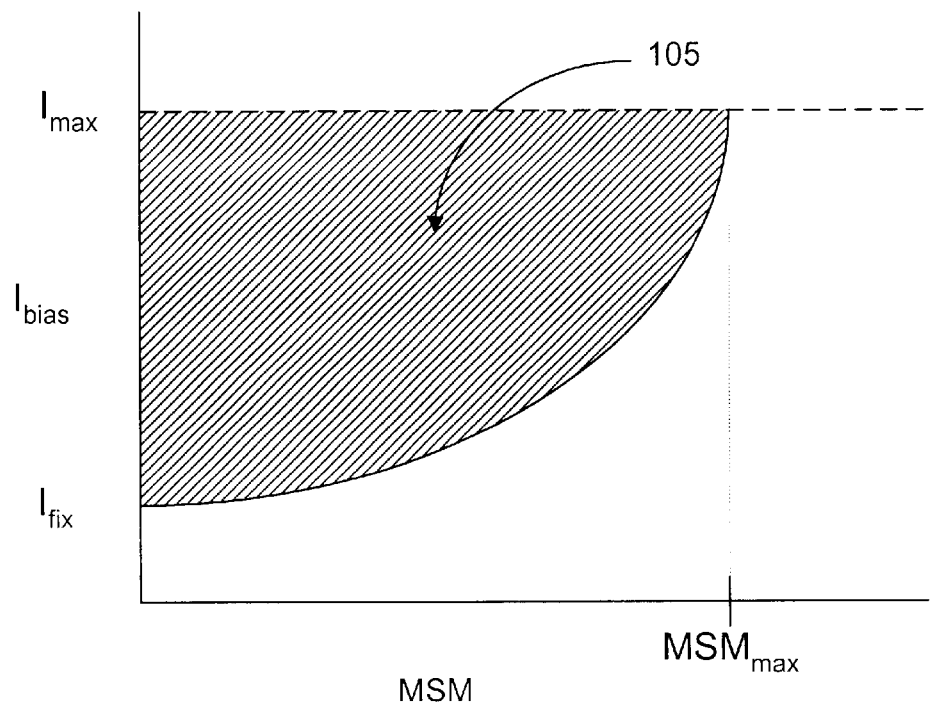

The advantage of the system of the subject invention in terms of reduced current consumption is illustrated in FIGS. 7A–7B. FIG. 7A is a curve illustrating the relationship between $P_{out}$, the output power of the transmission system of the subject invention, and the MSM signal, which, as described, is indicative of the desired output power level. The maximum output power is given by $P_{out}^{max}$, and the value of the MSM signal corresponding to this power level is $MSM_{max}$.

FIG. 7B is a curve illustrating the relationship between $I_{bias}$, the bias current to the power amplifier driver, and the MSM signal. As indicated, the current does not go below a minimum level, identified as $I_{fix}$ in the figure, and varies between $I_{fix}$ and $I_{max}$, the level corresponding to $P_{out}^{max}$, depending on the value of the MSM signal. Compared to conventional driver systems for class A power amplifiers, in which the bias current is fixed at $I_{max}$ regardless of the level of output power, the driver system consumes less current and therefore less power. In a scenario in which the output power varies from low to maximum levels, the current savings achieved by virtue of the subject invention is indicated by the hatched region 105 in FIG. 7B.

Compared to class AB power amplifier drivers, where there is an increase in current with increasing power levels which comes about due to the non-linear characteristics of the device, the subject invention provides a power amplifier driver in which the bias current thereof is controlled in a much more predictable way. Consequently, the driver system of the subject invention can in some sense be termed a pseudo class AB driver.

While particular embodiments, implementations, and implementation examples have been illustrated and described, it should be appreciated by those of skill in the art that additional embodiments, implementations, and implementations are within the scope of the invention, and that the subject invention is not to be limited except in light of the claims and their equivalents.

What is claimed is:

1. A transmission system for a wireless communication device comprising:

a variable gain amplifier for amplifying an input signal at a variable level of amplification determined responsive to a signal indicative of a desired output power, and outputting the amplified signal;

a circuit for outputting a variable bias current determined responsive to the signal indicative of the desired output power;

a driver having a variable level of linearity for driving a power amplifier responsive to the output of the variable gain amplifier, the level of linearity of the driver determined responsive to the bias current, whereby the level of linearity of the driver may be varied responsive to desired output power, and need not be set at a level consistent with maximum desired output power; and a power amplifier which is driven by the driver.

2. A transmission system for a wireless communication device comprising:

a variable gain amplifier for amplifying an input signal at a variable level of amplification determined responsive to a signal indicative of a desired output power, and outputting the same;

a circuit for outputting a variable bias current determined responsive to the signal indicative of the desired output power, where the circuit has first and second portions, and the first portion outputs a substantially fixed current, and the second portion outputs a current which is proportional to the signal indicative of the desired output power;

a driver for driving a power amplifier responsive to the output of the variable gain amplifier at a level of linearity determined responsive to the bias current, whereby the level of linearity of the driver may be varied responsive to desired output power; and a power amplifier which is driven by the driver.

3. The system of claim 1 in which the bias current output from the circuit is exponentially related to the signal indicative of desired output power.

4. A transmission system for a wireless communication device comprising:
   a variable gain amplifier for amplifying an input signal at a variable level of amplification determined responsive to a signal indicative of a desired output power, and outputting the amplified signal;
   a circuit comprising a number n of substantially similar building blocks, wherein n is an integer, for outputting a variable bias current determined responsive to the signal indicative of the desired output power;
   a driver having a variable level of linearity for driving a power amplifier responsive to the output of the variable gain amplifier, the level of linearity of the driver determined responsive to the bias current, whereby the level of linearity of the driver need not be set at a level consistent with maximum desired output power; and
   a power amplifier which is driven by the driver.

5. A transmission system for a wireless communication device comprising:
   a variable gain amplifier for amplifying an input signal at a variable level of amplification determined responsive to a signal indicative of a desired output power, and outputting the same; p1 a circuit for outputting a variable bias current determined responsive to the signal indicative of the desired output power, where the circuit comprises a number n of substantially similar building blocks, n being an integer, and the number n of building blocks is selected to achieve a desired slope in the relationship between the bias current and the signal indicative of the desired output power level;
   a driver for driving a power amplifier responsive to the output of the variable gain amplifier at a level of linearity determined responsive to the bias current, and
   a power amplifier which is driven by the driver.

6. A transmission system for a wireless communication device comprising
   a variable gain amplifier for amplifying an input signal at a variable level of amplification determined responsive to a signal indicative of a desired output power, and outputting the same;
   a circuit for outputting a variable bias current determined responsive to the signal indicative of the desired output power, where the circuit comprises a number n of substantially similar building blocks, n being an integer, and each building block is a differential pair circuit;
   a driver for driving a power amplifier responsive to the output of the variable gain amplifier at a level of linearity determined responsive to the bias current; and
   a power amplifier which is driven by the driver.

7. The system of claim 1 wherein the power amplifier is a class A power amplifier.

8. A variable linearity driver system for a power amplifier comprising:
   a driver having a variable level of linearity for driving a power amplifier, the level of linearity of the driver being determined responsive to an input current; and
   a current source for providing the input current, the current source having a first portion and a second portion, the first portion outputting a substantially fixed current, and the second portion outputting a variable current determined responsive to a desired output power, whereby the level of linearity of the driver may be varied responsive to desired output power, and need not be set at a level consistent with maximum desired output power.

9. The driver system of claim 8 further comprising a power amplifier configured to be driven by the driver system.

10. The system of claim 9 wherein the power amplifier is a class A power amplifier.

11. A variable linearity driver system for a power amplifier comprising:
    a driver having a variable level of linearity for driving, a power amplifier, the level of linearity of the driver being determined responsive to a variable input current; and
    a circuit for providing the variable input current responsive to a differential mode signal indicative of desired output power, the circuit comprising a number n of differential pair circuits, wherein n is an integer selected to achieve a desired relationship between the current output by the circuit, and the signal indicative of desired output power, wherein the level of linearity of the driver need not be set at a level consistent with maximum desired output power.

12. A driver system for a power amplifier comprising:
    a driver for driving a power amplifier at a level of linearity determined responsive to a variable input current, and
    a circuit for providing the variable input current responsive to a differential mode signal indicative of desired output power, the circuit comprising a number n of differential pair circuits, wherein n is an integer selected to achieve a desired relationship between the current output by the circuit, and the signal indicative of desired output power, and each differential pair circuit comprises a current source, a differential pair of transistors, a first current mirror, and a second current mirror.

13. The system of claim 12 wherein the current source of the first differential pair circuit is a substantially fixed current source.

14. The system of claim 13 wherein the current source of the mth differential pair circuit, wherein m is an integer, is the output of the second current mirror of the (m−1)th differential pair circuits.

15. A method of driving a power amplifier comprising the following steps:
    receiving an indicator of a desired output power level;
    providing a driver of a power amplifier having a variable level of linearity;
    determining the level of linearity of the driver of the power amplifier responsive to the desired output power level;
    maintaining the level of linearity at or above a minimum level to avoid excessive channel leakage; and
    driving the power amplifier at the desired output power level, wherein the level of linearity of the driver may be varied responsive to desired output power, and need not be set at a level consistent with maximum desired output power.

16. A transmission system for a wireless communication device comprising:
    a variable gain amplifier for amplifying an input signal at a variable level of amplification determined responsive to a signal indicative of a desired output power, and outputting the amplified signal;
    a circuit for outputting a variable bias current determined responsive to the signal indicative of the desired output power;
    an amplifier subsystem having a variable level of linearity for amplifying the output of the variable gain amplifier, the level of linearity of the amplifier subsystem determined responsive to the bias current, whereby the level of linearity of the amplifier subsystem may be varied responsive to desired output power, and need not be set at a level consistent with maximum desired output power.

17. The transmission system of claim 16 wherein the amplifier subsystem includes a driver and a power amplifier.

18. A variable linearity amplification system comprising:
an amplifier subsystem having a variable level of linearity, the level of linearity of the amplifier subsystem being determined responsive to an input current; and
a current source for providing the input current, the current source having a first portion and a second portion, the first portion outputting a substantially fixed current, and the second portion outputting a variable current determined responsive to a desired output power, whereby the level of linearity of the amplifier subsystem may be varied responsive to desired output power, and need not be set at a level consistent with maximum desired output power.

19. The system of claim 18 wherein the amplifier subsystem includes a driver and a power amplifier.

20. A method of determining the level of linearity of an amplifier system having a variable level of linearity comprising the following steps:
receiving an indicator of a desired output power;
setting a bias current to the amplifier system responsive to the indicator; and
determining the level of linearity of the amplifier system responsive to the bias current, wherein the level of linearity of the amplifier system may be varied responsive to desired output power, and need not be set at a level consistent with maximum desired output power.

21. The method of claim 20 wherein the amplifier system includes a driver and a power amplifier.

22. A transmission system for a wireless communication device comprising:
variable gain amplifying means for amplifying an input signal at a variable level of amplification determined responsive to a signal indicative of a desired output power, and outputting the amplified signal;
current means for outputting a variable bias current determined responsive to the signal indicative of the desired output power;
amplifying means having a variable level of linearity for amplifying the output of the variable gain amplifying means, the level of linearity of the amplifying means determined responsive to the bias current, whereby the level of linearity of the amplifying means may be varied responsive to desired output power, and need not be set at a level consistent with maximum desired output power.

23. A variable linearity amplification system comprising:
amplifying means having a variable level of linearity, the level of linearity of the amplifying means being determined responsive to an input current; and
current means for providing a variable current determined responsive to a desired output power, whereby the level of linearity of the amplifying means may be varied responsive to desired output power, and need not be set at a level consistent with maximum desired output power.

24. The system of claim 23 wherein the amplifying means includes a driver and a power amplifier.

25. The system of claim 24 wherein the amplifying means includes a driver and a power amplifier.

26. A transmission system for a wireless communication device comprising:
a variable gain amplifier for amplifying an input signal at a variable level of amplification determined responsive to a signal indicative of a desired output power, and outputting the amplified signal;
a circuit for outputting a bias signal determined responsive to the signal indicative of the desired output power;
an amplifier having a variable level of linearity for amplifying the output of the variable gain amplifier, the level of linearity of the amplifier determined responsive to the bias signal, whereby the level of linearity of the amplifier may be varied responsive to desired output power, and need not be set at a level consistent with maximum desired output power.

27. The system of claim 26 wherein the circuit has a first portion for outputting a substantially fixed signal, and a second portion for outputting a variable signal determined responsive to the signal indicative of desired output power.

28. The system of claim 26 wherein the amplifier is a driver for driving a power amplifier.

29. The system of claim 26 wherein the signal indicative of desired output power is a differential mode signal.

30. The system of claim 26 in which the bias signal output from the circuit is exponentially related to the signal indicative of desired output power.

31. The system of claim 26 in which the circuit comprises a number n of substantially similar building blocks, wherein n is an integer.

32. The system of claim 31 wherein the number n of building blocks is selected to achieve a desired relationship between the bias signal and the signal indicative of the desired output power level.

33. The system of claim 31 wherein at least one building block is a differential pair circuit.

34. The system of claim 28 wherein the driver is a class A power amplifier driver.

35. The system of claim 26 wherein the bias signal is a bias current.

36. An amplifier system comprising:
an amplifier for amplifying an input signal at a variable level of linearity determined responsive to a bias signal; and
a circuit for providing the bias signal, the circuit having a first portion and a second portion, the first portion outputting a substantially fixed signal, and the second portion outputting a variable signal determined responsive to a control signal, whereby the level of linearity of the amplifier may be varied responsive to the control signal.

37. The system of claim 36 wherein the amplifier is a driver for driving a power amplifier.

38. The system of claim 36 wherein the driver is a class A power amplifier driver.

39. The system of claim 36 wherein the control signal is indicative of desired output power.

40. The system of claim 36 wherein the control signal is a differential mode signal.

41. The system of claim 36 wherein the circuit comprises a number n of differential pair circuits, wherein n is an integer selected to achieve a desired relationship between the bias signal output by the circuit, and the control signal.

42. The system of claim 41 wherein at least one differential pair circuit comprises a current source, a differential pair of transistors, a first current mirror, and a second current mirror.

43. The system of claim 42 wherein the current source of the first differential pair circuit is a substantially fixed current source.

44. The system of claim 42 wherein the current source of the mth differential pair circuit, wherein m is an integer, is the output of the second current mirror of the (m−1)th differential pair circuits.

45. The system of claim 36 wherein the bias signal is a bias current.

46. A method of amplifying an input signal comprising the following steps:

receiving a control signal;

varying a bias signal responsive to the control signal;

maintaining the bias signal above a minimum level;

varying the level of linearity of an amplifier responsive to the bias signal; and amplifying the input signal using the amplifier.

47. The method of claim 46 wherein the amplifier is a driver.

48. The method of claim 46 wherein the bias signal is a bias current.

* * * * *